United States Patent [19]

Bensussan et al.

[11] Patent Number: 4,490,854
[45] Date of Patent: Dec. 25, 1984

[54] TRANSISTOR MIXER FOR ULTRA-HIGH FREQUENCY TRANSMITTERS

[75] Inventors: André Bensussan; Patrice Birot; Claude Van Kerrebroeck; Jean-Claude Curtinot, all of Paris, France

[73] Assignee: Thomson C.S.F., Paris, France

[21] Appl. No.: 461,495

[22] Filed: Jan. 27, 1983

[30] Foreign Application Priority Data

Jan. 12, 1982 [FR] France .................. 82 02346

[51] Int. Cl.³ .................................................. H04B 1/04
[52] U.S. Cl. ...................................... 455/118; 455/333; 332/16 T; 332/31 T
[58] Field of Search .............. 455/91, 110, 118, 321, 455/323, 333; 332/16 T, 9 T, 43 B, 31 T

[56] References Cited

U.S. PATENT DOCUMENTS

| | | | |
|---|---|---|---|
| 3,040,255 | 6/1962 | Mukai . | |
| 3,621,473 | 11/1971 | Stoffer | 332/16 T |
| 3,806,812 | 4/1974 | Ellis et al | 455/118 |
| 4,327,445 | 4/1982 | Tanaka | 455/118 |

FOREIGN PATENT DOCUMENTS 2147559  3/1973  Fed. Rep. of Germany .
1145253  10/1957  France .

OTHER PUBLICATIONS

Radio Monitor Electronic, vol. 42, No. 6, 6/1976, Munich, "Mischteil Mit Pin—Dioden—Regelung Für HiFi—Spitzengbrate" by Krajenski.
"Performance of Some GaAs Mesfet Mixers", Harrop et al., 6th European Microwave Conference, Rome, Sep. 1976.
"Fet Mixers for Communication Satellite Transponders" by Bura et al., IEEE MTT—S International Microwave Symposium, Cherry Hill, 6/1976.
"UKW—Tungr Mit Feldeffekt-Transistoren" by Demtroder et al., Funkschau, vol. 38, No. 22, Nov. 1966.

Primary Examiner—Jin F. NG
Attorney, Agent, or Firm—Cushman, Darby & Cushman

[57] ABSTRACT

A mixer transistor of the MESFET type comprising an emitter transistor connected to the drain or source electrode of the MESFET transistor for supplying an intermediate frequency. A local oscillator signal is applied to the gate of the MESFET transistor. A filter is connected to the drain or source electrode of the MESFET transistor through which the signal resulting from the mixing is obtained.

2 Claims, 7 Drawing Figures

TRANSISTOR MIXER FOR ULTRA-HIGH FREQUENCY TRANSMITTERS

BACKGROUND OF THE INVENTION

The present invention relates to a transistor mixer for ultra-high frequency transmitters.

By mixer is meant an electronic device which ensures the mixing of two periodic signals of different frequencies so as to deliver a single signal whose frequency spectrum contains at least one frequency equal to the sum or the difference of the frequencies of the two signals which are applied thereto.

A conventional solution for constructing ultra-high frequency mixers consists in using silicon or gallium arsenide Schottky diodes. These diodes comprise a weakly doped semiconductor metal junction which allows them to operate at very high frequencies, higher than 1 GHz. The conversion losses of Schottky diode mixers, corresponding to the difference in decibels of the power available at their input and that available at their output, could in theory be almost zero, if their outputs were perfectly matched to the frequencies of the spectral lines of the spectrum of the signal obtained at the output and if all the powers of the non essential spectral lines of the spectrum were recovered.

Now, in practice, it is impossible to control all the terminal impedances of a mixer for each frequency. The only controllable frequency is the image frequency of the frequency received at the input of the mixer with respect to the other frequency. The sum frequency resulting from the sum of the frequencies of the two signals applied to the input is, in receiving devices, very high and is generally uncontrollable. Consequently, the conversion losses of a Schottky diode mixer are not zero and since generally there must be associated with the mixer an amplifier placed before or after it, to obtain a usable signal, the conversion losses of the mixer are added to the noise factor of the amplifier to which it is coupled. In practice, noise factors of 4 to 8 decibels are to be found in electromagnetic wave receivers comprising Schottky diode mixers coupled to their amplifier. As far as transmitter construction is concerned, the conversion losses require an increase in the power of the local oscillator, which consequently increases the energy consumed by the oscillator. In some applications, such for example as the construction of telecommunications satellites, the increase in consumed energy results in larger sized electric energy production generators.

To reduce the conversion losses, some ultra-high frequency mixers are constructed from field effect unipolar transistors of the MESFET type whose control gate is formed by a Schottky diode. Despite the high series resistance presented by the Schottky diode of these transistors, the resulting attenuation is partly compensated for by the gain of the transistors at their operating frequency. Moreover, each of these transistors acts as a switch and the variation of its gain as a function of the level of the signals applied allows mixing to be obtained whose level depends on the gain of the transistor. However, the gain obtained is not generally sufficient and this type of construction often requires an amplifier placed upstream and downstream of the ultra-high frequency mixer transistor. This poor result is partly explained by the fact that the operating zone, from the point of view of the drain-source current characteristics as a function of the drain-source voltage, of the MESFET transistor is limited to within a small parallelogram, whose sides have dimensions related to the deviation $V_g$ of the voltage of each of the signals applied to the gate of the transistor and whose angle of slope is related to the difference of the slopes of the two straight load lines of the transistor corresponding to each of the frequencies of the signals applied to its gate. To increase the efficiency in this type of construction, efforts are naturally made to increase the area of the parallelogram but this is rapidly limited by the appearance of a gate current which is destructive for the transistor.

SUMMARY OF THE INVENTION

It is the object of this invention to obviate the above-mentioned disadvantages by means of a device which allows a maximum deviation in the non linear regions of the transistors used, so as to improve the conversion gain of the ultra-high frequency mixers.

To this end, the invention provides a transistor mixer for ultra-high frequency transmitters, for mixing a signal supplied by a local oscillator with a useful signal of intermediate frequency, so as to obtain a mixed signal whose frequency spectrum contains the sum or the difference of the frequencies, respectively, of the signals supplied by the local oscillator and of the useful intermediate frequency signal, the mixer comprising at least one transistor of the MESFET type having a gate electrode, a drain electrode and a source electrode, first means for ensuring static biassing of the transistor in a non linear conduction zone thereof, second means for applying the signal supplied by the local oscillator to the gate electrode, third means for applying the intermediate frequency signal to one of the other two drain or source electrodes and fourth means for taking the signal resulting from the mixing from the drain or source electrode to which the intermediate frequency signal is applied.

BRIEF DESCRIPTION OF THE DRAWINGS

Other features and advantages of the invention will appear during the description made with reference to the accompanying drawings, given solely by way of examples and in which.

DETAILED DESCRIPTION OF THE INVENTION

Figure 1:
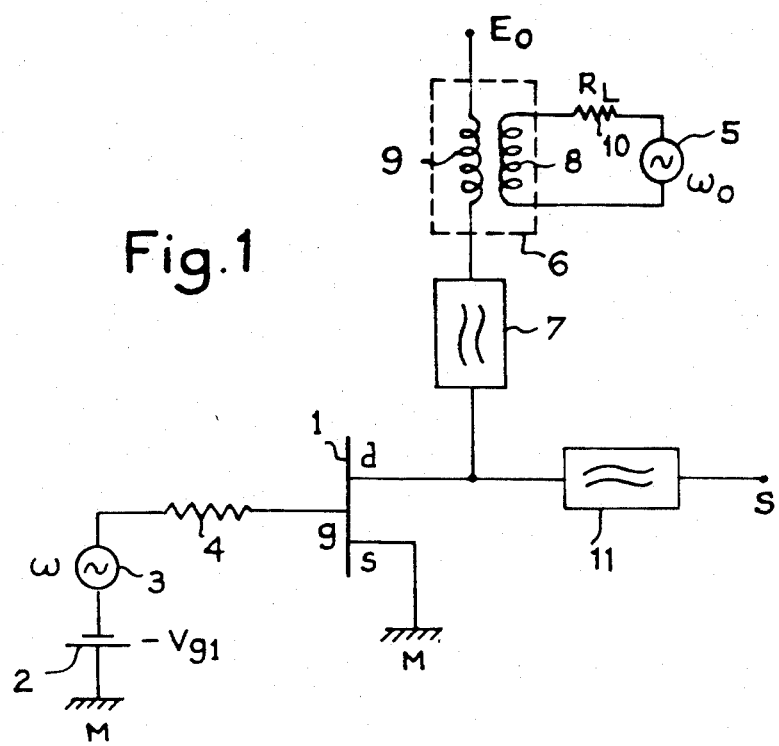
FIGS. 1 to 6 shows embodiments of mixers with drain modulation.

The mixer device of FIG. 1 comprises a unipolar transistor 1 of the MESFET type comprising a source electrode s connected to the ground of the device, a drain electrode d and a gate electrode g. The gate electrode is biassed by a generator 2 generating a DC voltage $-V_{g1}$ through a generator 3 generating an AC voltage of pulsation $\omega$ playing the role of a local oscillator and a resistor 4 mounted in series. The drain electrode is biassed by a DC voltage $E_o$ which is applied to the drain through a transformer 6 and high frequency filter 7. The transformer 6 which is used here as a modulator of the drain voltage comprises a primary winding 8 and a secondary winding 9. The primary winding 8 is fed with an AC voltage of pulsation $\omega_o$ supplying the intermediate frequency signal through a resistor 10. The secondary winding 9 is connected at one end to the DC voltage source $E_o$ and at its other end to an end of filter 7. The other end of filter 7 is connected to the drain electrode of transistor 1. The drain electrode of transistor 1 is connected to the output S of the device through the high frequency filter 11.

Figure 2:
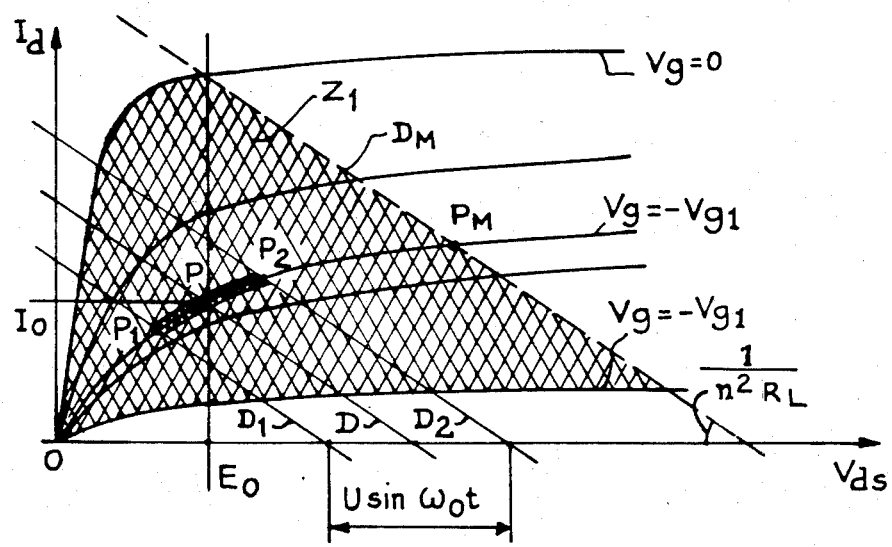

The operation of the mixer device shown in FIG. 1 is now described with reference to the diagram of FIG. 2 showing the movements of the straight load line of the transistor 1 in the plane of the characteristics $I_d = f(V_{ds})$ of the transistor for different values of the gate voltage $V_g$. $I_d$ is the drain-source current and $V_{ds}$ is the voltage between the drain electrode and the source electrode of transistor 1. The static biassing point P of the transistor, in the absence of modulation by the AC voltages applied to the gate and to the drain, is situated at the intersection of the characteristic curve $I_d = f(V_{ds})$ for the voltage $-V_{g1}$ biassing the gate and the straight line orthogonal to axis $V_{ds}$ passing through point $V_{ds} = E_o$ which represents the DC supply voltage for the drain of transistor 1. To biassing point P there corresponds a static current $I_o$ on the straight line $I_d$. If n is the transformation ratio between primary 8 and secondary 9 of transformer 6 and if $R_L$ is the value of resistor 10, the resistance reflected in the secondary 9 of the transformer is equal to $n^2 \times R_L$. This reflected resistance determines the slope of the dynamic straight load line of transistor 1. During modulation of the voltage of the drain of transistor 1 by the voltage source 5 of pulsation $\omega_o$, the straight dynamic load line D moves parallel to itself and point P occupies alternately positions $P_1$ and $P_2$ on characteristic $-V_{g1}$ when no modulation exists on the gate of the transistor. The amplitude of the movement of point P depends naturally on the amplitude of the AC voltage delivered by generator 5. This amplitude may be very great and point P may sweep the characteristic $-V_{g1}$ from point O of coordinates $I_d = 0$ and $V_{ds} = 0$ to a maximum point $P_M$ situated on the characteristic curve $V_g = -V_{g1}$ at the beginning of the linear part of this curve. Point $P_M$ is naturally situated on a straight line $D_M$ of slope $-1/n^2R_L$. It can be immediately seen, when the gate voltage of transistor 1 is modulated by the AC voltage which is delivered by generator 3, that point P moves within a zone $Z_1$. Zone $Z_1$ is situated inside a contour defined by the straight line $D_M$, the characteristic $I_d = f(V_{ds})$ for $V_g = 0$ volt and the characteristic $I_d = f(V_{ds})$ for the gate voltage $V_g = -V_p$ corresponding to the pinch voltage beyond which too high a reverse current may cause destruction of transistor 1.

Figure 3:
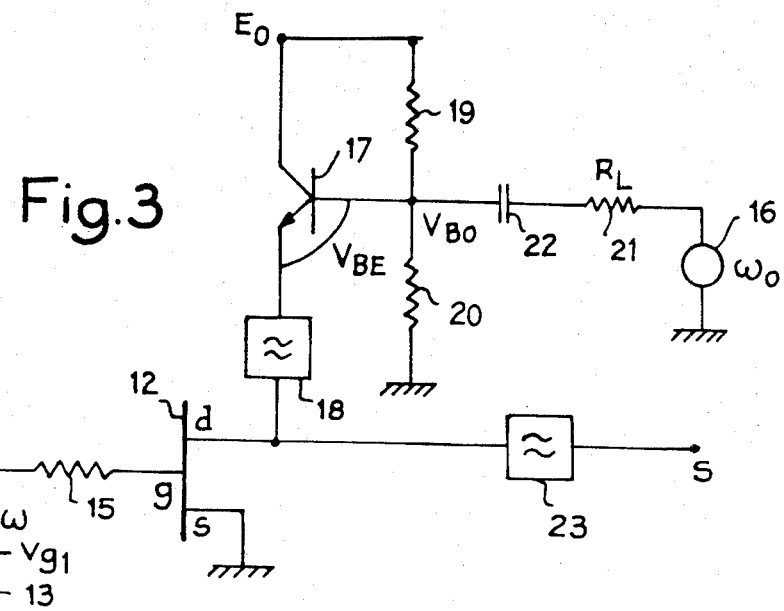

A second embodiment of the mixer of the invention is shown in FIG. 3. In this figure, the mixer comprises a unipolar transistor 12 of the MESFET type comprising as before a gate g, a drain d and a source s. Source s is connected to the ground of the device. The gate is biassed by a DC voltage $-V_{g1}$ delivered by a DC voltage source 13 through a generator 14 generating an AC voltage of pulsation playing the role of a local oscillator and a resistor 15 connected in series. The drain electrode d is modulated by an AC voltage delivered by an intermediate frequency generator 16 through a transistor 17 which is here used as a modulator of the drain voltage. Transistor 17 has its collector connected to a DC supply voltage $E_o$ and its emitter is connected to the drain of transistor 12 through a high frequency filter 18. The base of transistor 17 is biassed by means of a voltage divider formed by resistors 19 and 20 which are connected to the output of the DC supply source $E_o$. The AC voltage delivered by generator 16 is applied to the base of transistor 17 through a resistor 21 and a capacitor 22 connected in series. The drain of transistor 12 is also connected to the output of the mixer device through a filter 23.

Figure 4:
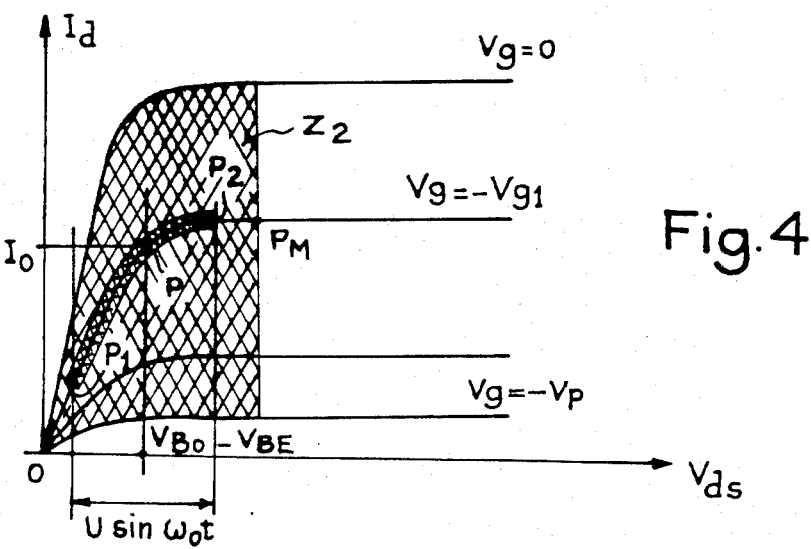

The operation of the device shown in FIG. 3 is explained below with reference to the graph of FIG. 4. In this circuit the modulation voltage delivered by generator 16 is applied to the drain electrode of transistor 12 through an emitter-follower connected transistor. Consequently, the static biassing voltage at the drain of transistor 12 is equal to voltage $V_{BO}$ appearing at the terminals of resistor 20 of the voltage divider formed by resistors 19 and 20, less the voltage $V_{BE}$ appearing between the base and the emitter of transistor 17. Since transistor 12 is biassed at its gate by the DC voltage $-V_{g1}$, the static current flowing through transistor 12 is the current $I_o$ which appears on the characteristic curves $I_d = f(V_{ds})$ of transistor 12 at the intersection of the straight line orthogonal) to the axis $V_{ds}$ passing through the point $V_{BO} - V_{BE}$ situated on axis $V_{ds}$ and the curve $I_d = f(V_{ds})$ for the voltage $-V_{g1}$ biassing the gate. The point P, of coordinates $I_d = I_O$ and $V_{BO} - V_{BE}$ which results therefrom is the static biassing point of transistor 12. Point P, in the absence of an AC voltage developed at the gate of transistor 12 moves between point $P_1$ and $P_2$ of the characteristic of $I_d = f(V_{ds})$ corresponding to the gate biassing equal to $-V_{g1}$ at the rate of the oscillation of the AC voltage delivered by generator 16. As in the case of FIG. 2, it is possible to cause point P to move over the characteristic curve corresponding to the voltage $-V_{g1}$ between point O of the characteristics for which current $I_d = 0$ and the voltage $V_{ds} = 0$ and a maximum point $P_M$ situated at the boundary of the non linear part and the linear part of the characteristic curve corresponding to the voltage $-V_{g1}$ biassing the gate. It can then consequently be deduced therefrom, when a modulating voltage is applied to the gate of transistor 12 and simultaneously another modulating voltage is applied to its drain, that the operating zone of the mixer of FIG. 3 is situated inside zone $Z_2$ defined by the straight line orthogonal to axis $V_{ds}$ passing through point $P_M$, the characteristic curve $I_d = f(V_{ds})$ of transistor 12 for the gate voltage $V_g = 0$ and the characteristic curve $I_d = f(V_{ds})$ of transistor 12 for the gate voltage $V_g = -V_p$ corresponding to the pinch voltage of transistor 12. As in the case of the device shown in FIG. 1, the biassing mode of the device of FIG. 3 allows complete sweeping of the non linear zone of transistor 12.

Figure 5:
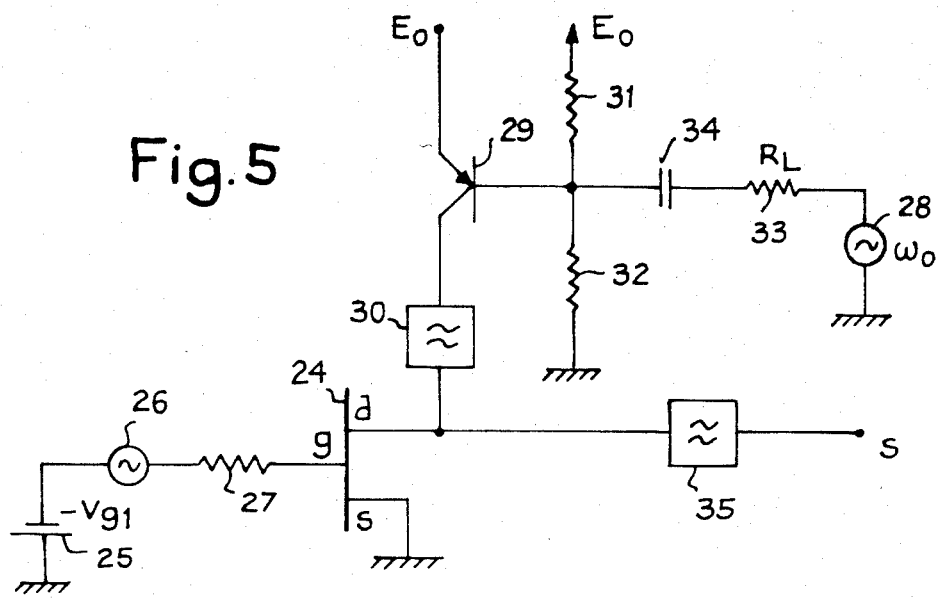
Figure 6:
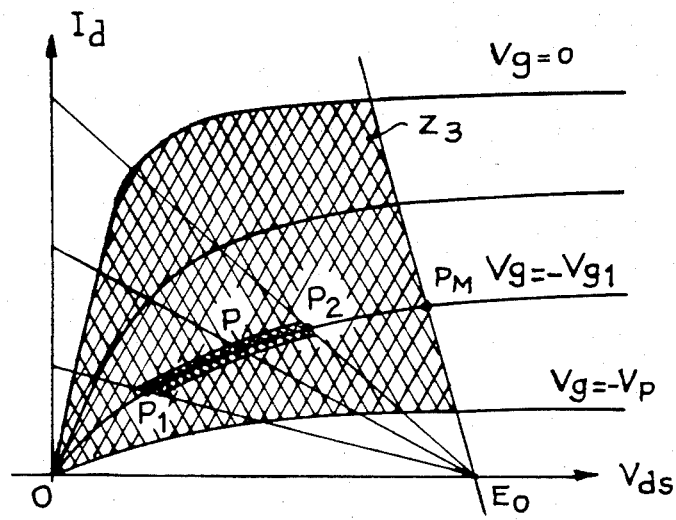

In the variation shown in FIG. 5, the slope of the straight load line of the unipolar transistor is made variable at the rate of one of the two frequencies applied to the mixer. The device shown in FIG. 5 comprises a unipolar transistor 24 of the MESFET type biassed at its gate electrode by a DC voltage $-V_{g1}$ delivered by generator 25. The gate electrode g is fed by an AC voltage source 26, forming a local oscillator, through a resistor 27. Transistor 24 is fed at its drain by an AC voltage source 28 supplying the intermediate frequency of pulsation $\omega_o$, through a modulator of the drain voltage formed from a common emitter connected PNP transistor 29 whose emitter is connected to a DC voltage source $E_o$. The collector of transistor 29 is connected to the drain of transistor 24 through a filter 30. The base of transistor 29 is biassed by a voltage divider, formed of resistors 31 and 32 which are fed from the DC voltage source $E_o$. The base of transistor 29 is also connected to the output of the AC voltage generator 28 through a resistor 33 and a capacitor 34 connected in series. The drain of transistor 24 is also connected to the output of the mixer device through filter 35.

In the case of FIG. 5, the straight load line of transistor 24 is formed by the emitter-collector resistance of transistor 29 and the value of this resistance varies as a function of the AC voltage applied to its base. Consequently, the static biassing point of transistor 24 varies, as in the preceding cases, between points $P_1$ and $P_2$ of the characteristic $I_d=f(V_{ds})$ for the gate voltage $V_g=-V_{g1}$. When generator 26 applies an AC voltage to the gate of transistor 24, the biassing point P moves within a zone $Z_3$ depending on the amplitude of the AC voltages applied to the gate and to the drain of transistor 24. Zone $Z_3$ is determined by a straight load line connecting point $E_o$ on the straight line $V_{ds}$ to a point $P_M$ on the characteristic $I_d=f(V_{ds})$ for the gate voltage $V_g32 -V_{g1}$ situated as before at the boundary of the linear part and the non linear part of this characteristic curve and, on the other hand, between the characteristic curves of $I_d=f(V_{ds})$ plotted for the gate voltage $V_g=0$ volt and the characteristic curve plotted for the pinch gate voltage equal to $-V_p$.

Figure 7:
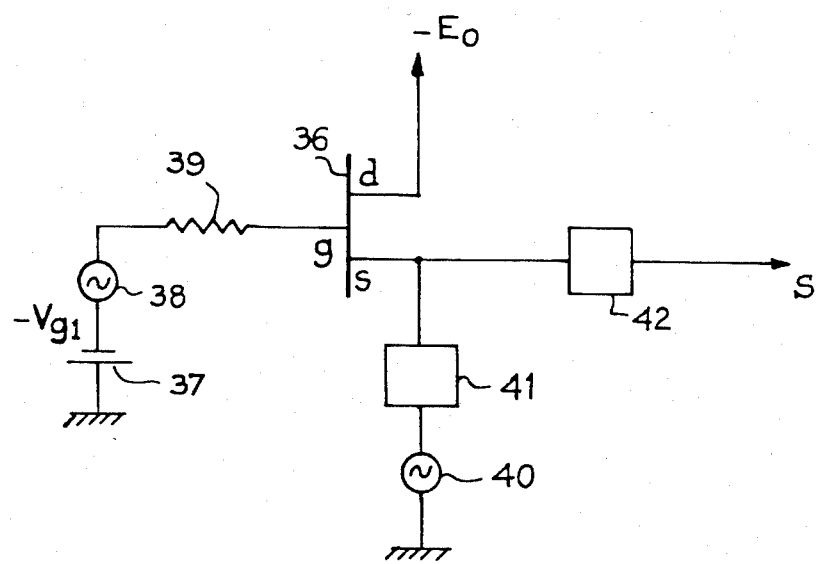
FIG. 7 shows one embodiment of a mixer with source electrode modulation.

Although in the embodiments of the invention which have just been described, the source electrode of the mixer transistor is connected to the ground plane and that an AC voltage is applied to its drain electrode, it will be readily understood that it is also possible, in other embodiments, to reverse the role of the drain and source electrodes as in the example shown in FIG. 7. In this figure, the gate of transistor 36 is biassed, as in the preceding circuits, by a DC voltage $-V_{g1}$ delivered by a generator 37 and is fed from an AC voltage source 38 forming local oscillator through a resistor 39. Contrary to the preceding embodiments, the drain electrode of transistor 36 is connected to a DC voltage source $-E_o$ and the source electrode is connected to an AC voltage source 40 supplying the intermediate frequency through a high frequency filter 41. A filter 42 connects the source electrode of transistor 36 to the output S of the device.

What is claimed is:

1. A transistor mixer for ultra-high frequency transmitters, for mixing a signal supplied by a local oscillator with a useful intermediate frequency signal so as to obtain a mixed signal whose frequency spectrum contains the sum or the difference of the frequencies respectively of the signal supplied by the local oscillator and of the useful intermediate frequency signal, the mixer comprising at least one transistor of the MESFET type having a gate electrode, a drain electrode and a source electrode, first means connected to the gate electrode for providing static biasing of the transistor in a non linear conduction zone thereof, second means for applying the signal supplied by the local oscillator to the gate electrode, third means for applying the intermediate frequency signal to the drain or source electrode, said third means comprising an emitter-follower transistor whose emitter is connected to the drain or source electrode of the mixer transistor receiving the intermediate frequency, the base of said emitter-follower transistor being fed with the intermediate frequency signal and fourth means for taking the signal, resulting from the mixing, from the drain or source electrode to which the intermediate frequency signal is applied.

2. A transistor mixer for ultra-high frequency transmitters, for mixing a signal supplied by a local oscillator with a useful intermediate frequency signal so as to obtain a mixed signal whose frequency spectrum contains the sum or the difference of the frequencies respectively of the signal supplied by the local oscillator and of the useful intermediate frequency signal, the mixer comprising at least one transistor of the MESFET type having a gate electrode, a drain electrode and a source electrode, first means connected to the gate electrode for providing static biasing of the transistor in a non linear conduction zone thereof, second means for applying the signal supplied by the local oscillator to the gate electrode, third means for applying the intermediate frequency signal to the drain or source electrode, said third means comprising a common emitter transistor whose collector is connected to the drain or source electrodes of the mixer transistor receiving the intermediate frequency, the base of said common emitter-transistor being fed with the intermediate frequency signal and fourth means for taking the signal, resulting from the mixing, from the drain or source electrode to which the intermediate frequency signal is applied.

* * * * *